US012127349B2

(12) United States Patent
Jang et al.

(10) Patent No.: US 12,127,349 B2
(45) Date of Patent: Oct. 22, 2024

(54) METHOD FOR TRANSFERRING MICRO DEVICE ON CURVED SURFACE AND APPARATUS FOR TRANSFERRING MICRO DEVICE ON CURVED SURFACE

(71) Applicants: KOREA INSTITUTE OF MACHINERY & MATERIALS, Daejeon (KR); CENTER FOR ADVANCED META-MATERIALS, Daejeon (KR)

(72) Inventors: Bongkyun Jang, Daejeon (KR); Jae-Hyun Kim, Daejeon (KR); Kyung-Sik Kim, Daejeon (KR); Seung-Mo Lee, Pohang (KR); Hyun June Jung, Daejeon (KR); Hak Joo Lee, Daejeon (KR)

(73) Assignees: KOREA INSTITUTE OF MACHINERY & MATERIALS, Daejeon (KR); CENTER FOR ADVANCED META-MATERIALS, Daejeon (KR)

( * ) Notice: Subject to any disclaimer, the term of this patent is extended or adjusted under 35 U.S.C. 154(b) by 815 days.

(21) Appl. No.: 15/733,942

(22) PCT Filed: Jun. 21, 2019

(86) PCT No.: PCT/KR2019/007550
§ 371 (c)(1),
(2) Date: Dec. 1, 2020

(87) PCT Pub. No.: WO2020/013477
PCT Pub. Date: Jan. 16, 2020

(65) Prior Publication Data
US 2021/0235588 A1    Jul. 29, 2021

(30) Foreign Application Priority Data
Jul. 11, 2018 (KR) .......................... 10-2018-0080375

(51) Int. Cl.
*H05K 3/20* (2006.01)
*B41M 1/06* (2006.01)
*H01L 21/683* (2006.01)

(52) U.S. Cl.
CPC ................. *H05K 3/20* (2013.01); *B41M 1/06* (2013.01); *H01L 21/6835* (2013.01); *H01L 2221/68368* (2013.01); *H05K 2203/0195* (2013.01)

(58) Field of Classification Search
CPC .... H05K 3/00; H05K 3/20; H05K 2203/0195; B41M 1/00; B41M 1/06; H01L 21/00;
(Continued)

(56) References Cited

FOREIGN PATENT DOCUMENTS

| KR | 10-1994-0002177 | 3/1994 |
| KR | 10-0971516 | 7/2010 |

(Continued)

*Primary Examiner* — Vishal I Patel
(74) *Attorney, Agent, or Firm* — LEX IP MEISTER, PLLC (57) ABSTRACT

A method for transferring a micro device on a curved surface according to an exemplary embodiment of the present invention includes: coating an adhesive layer on an external circumferential surface of a tube; providing a micro device pattern on one side of a substrate; positioning an external circumferential surface of the tube to contact the substrate and allow a length direction of the device pattern to cross a radius direction of the tube, and rotating the tube with respect to an axis-direction of the tube and simultaneously moving at least one of the tube and the substrate in a rectilinear way to transfer the micro device pattern on the substrate to the adhesive layer; and fixing the transferred micro device pattern to the adhesive layer by curing the adhesive layer.

9 Claims, 12 Drawing Sheets

(58) Field of Classification Search
CPC ....... H01L 21/60; H01L 21/68; H01L 21/683; H01L 21/6835; H01L 2221/68368
See application file for complete search history.

(56) References Cited

FOREIGN PATENT DOCUMENTS

| | | | |
|---|---|---|---|
| KR | 10-1255726 | 4/2013 | |
| KR | 10-2013-0061720 | 6/2013 | |
| KR | 10-2015-0093437 | 8/2015 | |
| KR | 20150093437 A * | 8/2015 | |
| KR | 10-2017-0011770 | 2/2017 | |
| WO | WO-2012027050 A2 * | 3/2012 | ............. B82Y 10/00 |

* cited by examiner

METHOD FOR TRANSFERRING MICRO DEVICE ON CURVED SURFACE AND APPARATUS FOR TRANSFERRING MICRO DEVICE ON CURVED SURFACE

BACKGROUND OF THE INVENTION

(a) Field of the Invention

The present invention relates to a method for transferring a micro device on a curved surface and an apparatus for transferring a micro device on a curved surface. More particularly, the present invention relates to a method for transferring a micro device on a curved surface and an apparatus for transferring a micro device on a curved surface for efficiently transferring a micro device on an external circumferential surface of a tube and increasing transfer efficiency.

(b) Description of the Related Art

A catheter is a flexible and thin tube in wide use in the medical field, and is a medical apparatus that is inserted into a human body when a disease is treated or an operation is performed. Therefore, it is manufactured of a medical material, and it has a flexible and thin tube shape.

In addition, when a flexible electrode is provided on the catheter surface, it is referred to as an electrode catheter, and an electrical field is generated by inputting a current to the electrode, and medical procedures on the human anatomy are performed by using it.

Hence, to generate an electrode pattern on the surface of the flexible tube such as the medical catheter, a method for patterning an electrode on a tube shaped curve is required.

However, regarding the conventional electrode patterning method, it is usual to pattern the electrode by using a planar mask on a planar substrate as in a semiconductor process.

The conventional method also includes a method for forming a pattern on a curve by using laser beams according to a method for patterning on a curved substrate, and a method for forming a pattern by printing liquefied ink on the surface.

However, from among the above-noted methods for forming a pattern on a curve, the method using laser beams or ink generates low productivity.

A method for transferring a discontinuous pattern onto a cylinder-shaped curve has been developed, but it is possible to transfer the same to an area that corresponds to a rotation of less than 360° with respect to an axis of a cylinder, so the method may not be applied to the case of transferring a continuous pattern of equal to or greater than 360° on the surface of the cylinder.

The above information disclosed in this Background section is only for enhancement of understanding of the background of the invention, and therefore it may contain information that does not form the prior art that is already known in this country to a person of ordinary skill in the art.

SUMMARY OF THE INVENTION

The present invention has been made in an effort to provide a method for transferring a micro device on a curved surface and an apparatus for transferring a micro device on a curved surface for efficiently transferring a micro device on an external circumferential surface of a tube, and increasing transfer efficiency.

The technical object aimed to be achieved by the present invention is not limited to the foregoing technical object, and other non-mentioned technical objects may be clearly understood by those skilled in the art from the description below.

An exemplary embodiment of the present invention provides a method for transferring a micro device on a curved surface, including: coating an adhesive layer on an external circumferential surface of a tube; providing a micro device pattern on one side of a substrate; transferring the micro device pattern on the substrate to the adhesive layer; and fixing the transferred micro device pattern to the adhesive layer by curing the adhesive layer.

The transferring the micro device pattern may include positioning an external circumferential surface of the tube to contact the substrate, and allow a length direction of the device pattern to cross a radius direction of the tube, and rotating the tube with respect to an axis-direction of the tube and simultaneously moving at least one of the tube and the substrate in a rectilinear way.

The coating of an adhesive layer may include pre-curing the adhesive layer so as to control adherence with the micro device pattern to be transferred to the adhesive layer.

The providing of a device pattern may include: providing a sacrificial layer on one side of a raw plate; providing the micro device pattern on the sacrificial layer; reducing adherence between the micro device pattern and the raw plate by weakening the sacrificial layer by etching; and transferring the micro device pattern to the substrate.

Another embodiment of the present invention provides an apparatus for transferring a micro device on a curved surface, including: a first supporter for supporting a substrate on which a micro device pattern is provided; a second supporter for rotating a tube having an external circumferential surface on which an adhesive layer is coated with respect to an axis-direction of the tube, positioning the external circumferential surface of the tube to contact the substrate, and supporting the tube so that a length direction of the device pattern may cross a radius direction of the tube; and a driver for transferring the micro device pattern on the substrate to an external circumferential surface of the rotating tube by moving at least one of the first supporter and the second supporter in a rectilinear way.

The first supporter may be installed on respective sides of the substrate in a direction crossing an axis-direction of the tube, and may include a tension applier for applying tension to the substrate.

A plurality of micro device patterns may be provided on the substrate, a plurality of second supporters and tubes may be installed to correspond to the plurality of micro device patterns, and the plurality of second supporters and the plurality of tubes may be separated from each other at gaps that correspond to gaps of the plurality of micro device patterns in a direction crossing the axis-direction of the plurality of tubes.

The substrate may have a planar shape, and the plurality of micro device patterns may be respectively provided in areas at predetermined gaps on the substrate in a direction crossing an axis-direction of the plurality of tubes.

The substrate may have a roller shape, and the first supporter may support the substrate in a roller shape so that the substrate may rotate with respect to an axis-direction of the substrate in a roller shape.

The axis-direction of the substrate in a roller shape and the axis-direction of the plurality of tubes may be parallel to each other, and the plurality of tubes may be installed to be closely attached to corresponding micro device patterns from among the plurality of micro device patterns having an external circumferential surface provided to the substrate in a roller shape.

The plurality of micro device patterns may be respectively provided in areas formed with a predetermined angle range in a circumferential direction on the substrate in a roller shape.

The driver may move the first supporter and the second supporter, respectively, independently in a rectilinear way.

The respective axis-directions of a plurality of tubes may be parallel to each other, and respective axis-directions of the plurality of tubes may cross an axis-direction of the substrate in a roller shape.

The driver may drive so that a rotating linear velocity of the substrate in a roller shape may be equivalent to a rectilinear moving speed, and it may drive so that respective rotating linear velocities of the plurality of tubes may be equivalent to a rectilinear moving speed.

According to the exemplary embodiments of the present invention, the micro device pattern may be transferred in a shape that continues by equal to or greater than 360° in a length direction of the tube to the external circumferential surface of the tube.

According to the exemplary embodiments of the present invention, a plurality of micro device patterns are provided on the substrate, and a plurality of tubes are provided corresponding to the respective micro device patterns to simultaneously transfer the micro device pattern to the tubes and accordingly increase transfer efficiency.

According to the exemplary embodiments of the present invention, the axis-direction of the roller crosses the axis-direction of a plurality of tubes, so a plurality of micro device patterns may be provided without being limited to the area having a predetermined angle range in the circumferential direction on the external circumferential surface of the roller. By this, the number of micro device patterns provided to the roller may be increased, thereby further increasing transfer efficiency.

The effects of the present invention are not limited to the foregoing effects, and it shall be understood that the effect of the present invention includes all of the effects inferable from the detailed description of the present invention or the configuration of the invention described in the claims.

DETAILED DESCRIPTION OF THE EMBODIMENTS

Hereinafter, the present invention will be described with reference to the accompanying drawings. As those skilled in the art would realize, the described embodiments may be modified in various different ways, all without departing from the spirit or scope of the present invention. Accordingly, the drawings and description are to be regarded as illustrative in nature and not restrictive, and like reference numerals designate like elements throughout the specification.

Throughout the specification, when it is described that a part is "connected (in contact with, coupled)" to another part, the part may be "directly connected" to the other element or "connected" to the other part through a third part. Unless explicitly described to the contrary, the word "comprise" and variations such as "comprises" or "comprising" will be understood to imply the inclusion of stated elements but not the exclusion of any other elements.

Further, terms used in the present specification are used for simply explaining a specific exemplary embodiment, and are not intended to limit the present invention. A singular expression includes a plural expression unless it is specifically described to the contrary in the context. It will be appreciated that terms "including" and "having" are intended to designate the existence of characteristics, numbers, steps, operations, constituent elements, and components described in the specification, or a combination thereof, and do not exclude a possibility of the existence or addition of one or more other characteristics, numbers, steps, operations, constituent elements, components, or a combination thereof in advance.

Hereinafter, exemplary embodiments of the present invention will be described in detail with reference to the accompanying drawings.

Figure 1:
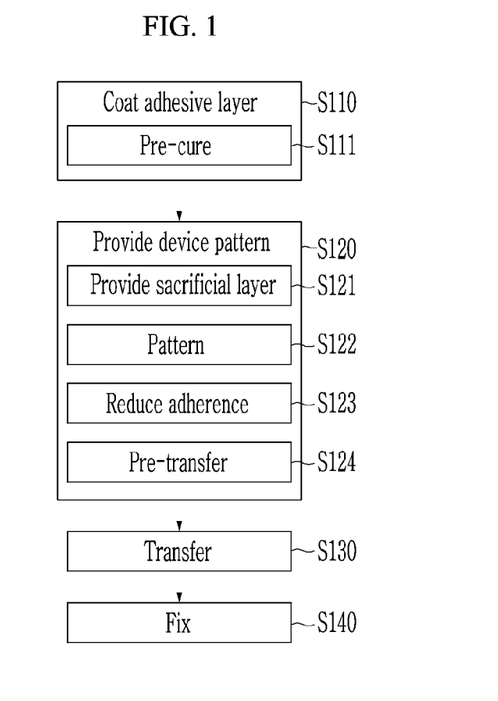
FIG. 1 shows a flowchart of a method for transferring a micro device on a curved surface according to a first exemplary embodiment of the present invention.
Figure 2:
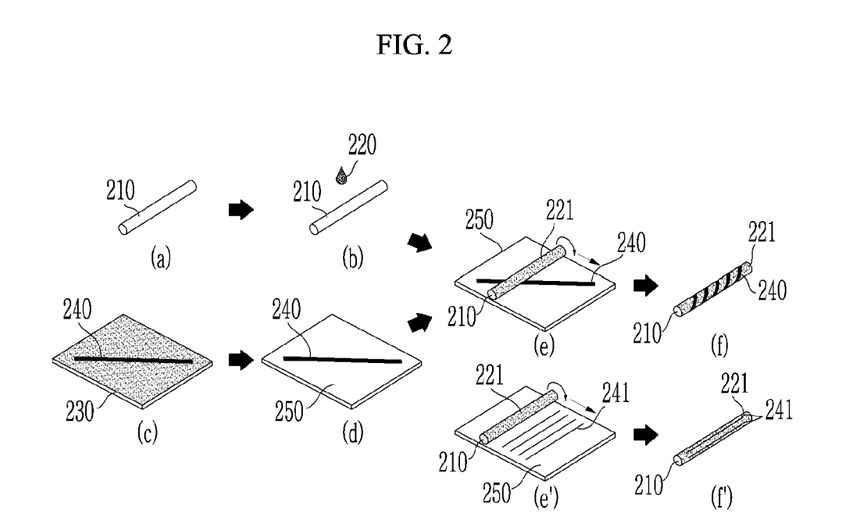
FIG. 2 and FIG. 3 show exemplary views of a process of a method for transferring a micro device on a curved surface according to a first exemplary embodiment of the present invention.
Figure 3:
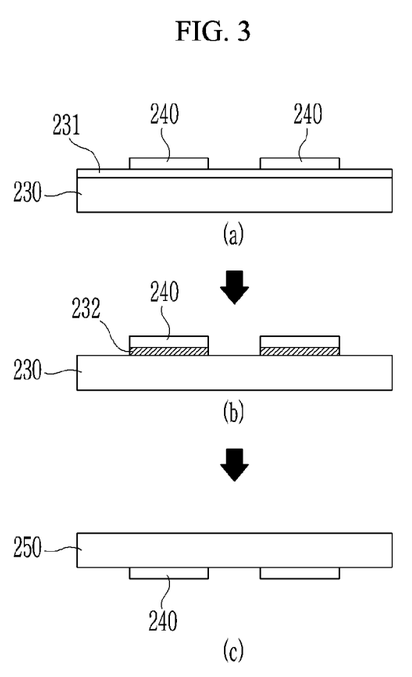

FIG. 1 shows a flowchart of a method for transferring a micro device on a curved surface according to a first exemplary embodiment of the present invention, and FIG. 2 and FIG. 3 show exemplary views of a process of a method for transferring a micro device on a curved surface according to a first exemplary embodiment of the present invention.

As shown in FIG. 1 and FIG. 2, a method for transferring a micro device on a curved surface may include coating an adhesive layer (S110), providing a device pattern (S120), transferring (S130), and fixing (S140).

The coating of an adhesive layer (S110) may include coating an adhesive layer 221 on an external circumferential surface of a tube 210.

Here, the tube 210 is not limited to a shape of which an inside is empty, and it may include a shape of which the inside is full. The tube 210 may also be analyzed to include an object having a curved surface.

The adhesive layer 221 may be formed by coating an adhesive 220 on the surface of the tube 210. As a method for coating an adhesive layer 221, a coating method using dipping, a method using gravity to generate a uniform thickness of an adhesive layer, and a method using centrifugal force by rotating a tube may be used (refer to FIG. 2 (a) and (b)).

The coating of an adhesive layer (S110) may include pre-curing an adhesive layer 221 so as to control adherence to the micro device pattern 240 to be transferred to the adhesive layer 221 (S111).

The pre-curing (S111) may be performed by using ultraviolet rays (UV), plasma, or heat, and after the pre-curing (S111) is performed, the adherence of the adhesive layer 221 coated on the surface of the tube 210 may be controlled to be transferable.

The providing of a device pattern (S120) may include providing a micro device pattern 240 on one side of a substrate 250.

The providing of a device pattern (S120) may include providing a sacrificial layer (S121), patterning (S122), reducing adherence (S123), and pre-transferring (S124).

As shown in FIG. 3, the providing of a sacrificial layer (S121) may include providing a sacrificial layer 231 to one side of a raw plate 230.

The patterning (S122) may include providing a micro device pattern 240 on the sacrificial layer 231.

The micro device pattern 240 may be a thin-film type of electrical part, or an electrode. For example, the micro device pattern 240 may include: a coil, a condenser, or a resistor in the case of an electrical circuit; a magnetic core using ferrite in the case of a magnetic material; and a transistor, a diode, or a thermistor in the case of a semiconductor device.

When the micro device pattern 240 is an electrode, the patterning (S122) includes forming a thin film on a planar substrate by using a method for laminating a copper foil formed by deposition, plating, or rolling, and forming a micro device pattern 240 in a desired electrode shape by using a conventional art such as lithography.

When the micro device pattern 240 has an electrical part form, the patterning S122 may include generating a micro device pattern 240 in an electrical part form by using a conventional skill for generating a device (refer to FIG. 3 (a)).

The reducing of adherence (S123) may include reducing adherence between a plurality of micro device patterns 240 and the raw plate 230 by weakening the sacrificial layer 231 by etching. When the reducing of adherence (S123) is performed, the sacrificial layer 231 is weakened by the etching and is then changed to a weakened sacrificial layer 232, and the adherence between the micro device pattern 240 and the raw plate 230 may be substantially reduced (refer to FIG. 3 (b)).

The pre-transferring (S124) may include transferring the micro device pattern 240 to the substrate 250.

The substrate 250 may have a planar shape, and for example, it may include a rigid plate shape and a flexible film shape. For another example, the substrate may have a roller shape (refer to FIG. 7).

The micro device pattern 240 with the weakened adherence with the raw plate 230 may be easily transferred to the substrate 250 (refer to FIG. 3 (c)).

According to another exemplary embodiment, the providing of a device pattern (S120) may include generally providing a material layer for a device pattern to a substrate with low adherence by using thin-film deposition or thin-film foil lamination, and providing a device pattern by using a mask and a lithography process.

The transferring (S130) may include positioning an external circumferential surface of the tube 210 to contact the substrate 250 and allow a length direction of the device pattern 240 to cross a radius direction of the tube 210, rotating the tube 210 with respect to an axis-direction of the tube 210 and simultaneously moving at least one of the tube 210 and the substrate 250 in a rectilinear way to transfer the micro device pattern 240 on the substrate 250 to the adhesive layer 221. In this instance, the radius direction of the tube 210 signifies a direction that is parallel to a planar side that is perpendicular to the axis-direction of the tube 210, and the length direction of the device pattern 240 signifies a direction in which the device pattern 240 provided on the substrate 250 extends. The movement in a rectilinear way signifies a translatory movement by which all material points of the corresponding configuration move in parallel by a same displacement, and the tube 210 in the transferring (S130) 0) may rotate with respect to the axis-direction of the tube 210. Concurrently, the tube 210 may be moved in one direction. In another way, the tube 210 may rotate with respect to the axis-direction, and the substrate 250 may be simultaneously moved in an opposite direction to the one direction. In any case, the micro device pattern 240 of the substrate 250 may be transferred to the external circumferential surface of the tube 210 by controlling the contact between the external circumferential surface of the tube 210 and the substrate 250 on which the micro device pattern 240 is formed.

The micro device pattern 240 may be oblique with respect to the axis-direction of the tube 210, and in this case, the micro device pattern 240 may be transferred in a shape (e.g., a spiral shape) that is continuous by equal to or greater than 360° in the length direction of the tube 210 to the external circumferential surface of the tube 210 (refer to FIG. 2 (e) and (f)). The micro device pattern 240 may be plural, not single as shown in the drawing.

As shown in FIG. 2 (e') and (f'), a micro device pattern 241 may be formed in parallel to the axis-direction of the tube 210, and in this case, the micro device pattern 241 may be transferred to the external circumferential surface of the tube 210, as a shape extending in the length direction of the tube 210.

The fixing (S140) may include fixing the transferred micro device pattern 240 to the adhesive layer 221 by completely curing the adhesive layer 221.

Hereinafter, an apparatus for transferring a micro device on a curved surface for realizing transferring of a micro device on a curved surface will now be described.

Figure 4:
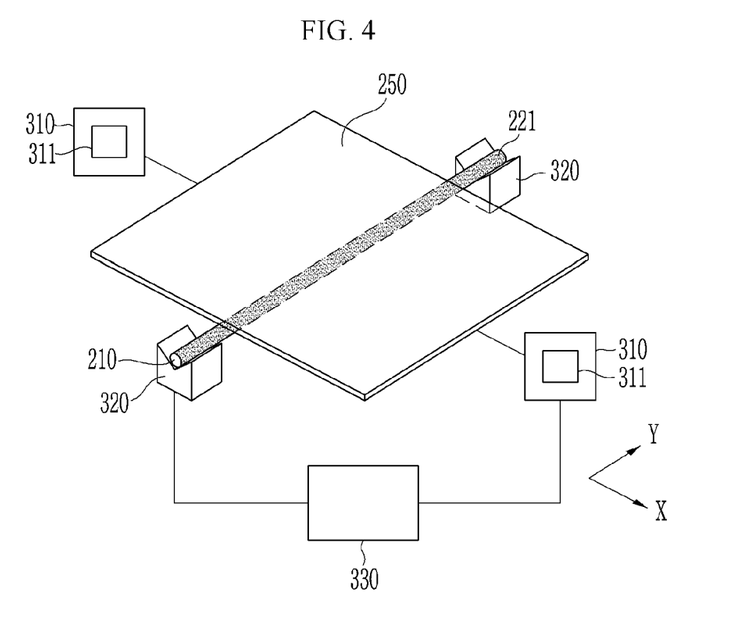
FIG. 4 shows an exemplary view of an apparatus for transferring a micro device on a curved surface according to a first exemplary embodiment of the present invention.

FIG. 4 shows an exemplary view of an apparatus for transferring a micro device on a curved surface according to a first exemplary embodiment of the present invention, and FIG. 5 to FIG. 8 show exemplary views of an operational example of an apparatus for transferring a micro device on a curved surface according to a first exemplary embodiment of the present invention.

Figure 5:
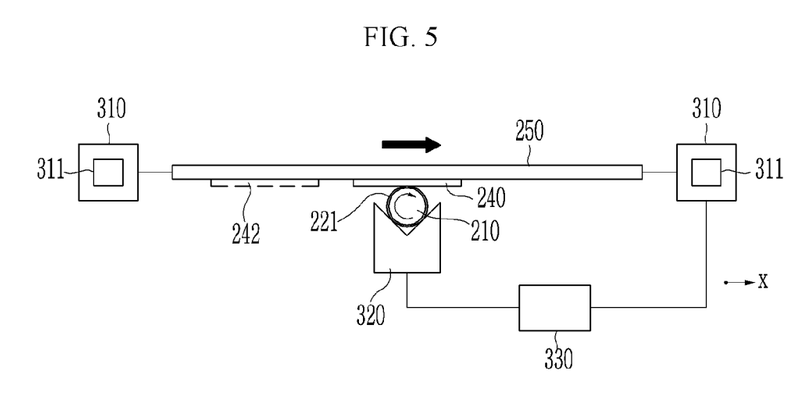
FIG. 5 to FIG. 8 show exemplary views of an operational example of an apparatus for transferring a micro device on a curved surface according to a first exemplary embodiment of the present invention.

As shown in FIG. 4 and FIG. 5, an apparatus for transferring a micro device on a curved surface may include a first supporter 310, a second supporter 320, and a driver 330.

The first supporter 310 may support the substrate 250 having one side on which the micro device pattern 240 is provided.

The first supporter 310 may be installed on respective sides of the substrate 250. Referring to FIG. 4, it may be installed on the respective sides of the substrate 250 in a direction (X-axis direction) crossing the axis-direction (Y-axis direction) of the tube 210. For example, the first supporter 310 may be combined to respective ends of the substrate 250 in the X-axis direction.

The first supporter 310 may include a tension applier 311, and the tension applier 311 may apply tension to the substrate 250.

The second supporter 320 may support the tube 210 having the external circumferential surface coated with the adhesive layer 221 so that the tube 210 may rotate with respect to the axis-direction of the tube 210. The second supporter 320 may support the tube 210 so that the external circumferential surface of the tube 210 may contact one side of the substrate 250 to which the micro device pattern 240 is provided. The second supporter 320 may position the tube 210 so that the radius direction of the tube 210 may cross the length direction of the device pattern 240.

The driver 330 may move at least one of the first supporter 310 and the second supporter 320 in a rectilinear way so that the micro device pattern 240 on the substrate 250 may be transferred to the external circumferential surface of the rotating tube 210. Through this, the tube 210 and the substrate 250 may be relatively moved.

For example, the driver 330 may drive the first supporter 310 so that the substrate 250 may be moved in the X-axis direction. As the substrate 250 moves, the tube 210 closely attached to one side of the substrate 250 rotates by a frictional force, and the micro device pattern 240 provided to one side of the substrate 250 may be transferred to the surface of the tube 210.

The driver 330 may drive the second supporter 320 so that the tube 210 may rotate at a rotating linear velocity that is equivalent to a transport speed of the substrate 250.

In another way, the driver 330 may move the second supporter 320 in the X-axis direction so that the tube 210 may move in the X-axis direction. The tube 210 closely attached to one side of the substrate 250 may rotate by a frictional force, and the micro device pattern 240 provided on one side of the substrate 250 may be transferred to the surface of the tube 210.

Here, the driver 330 may drive the second supporter 320 so that the tube 210 may rotate at a rotating linear velocity that is equivalent to a transport speed of the tube 210.

The driver 330 may include a controller (not shown) for calculating a moving speed of the substrate 250 and a moving speed and a rotating linear velocity of the tube 210, and controlling operations of the first supporter 310 and the second supporter 320 according to calculation results.

A plurality of micro device patterns may be provided on the substrate 250. In this case, when one of the micro device patterns 240 is finished being transferred to the tube 210 combined to the second supporter 320, the transferred tube 210 may be separated from the second supporter 320. A new tube may be combined to the second supporter 320, and another micro device pattern 242 may be transferred to the new tube.

When the substrate 250 has a rigid plate shape, the first supporter 310 may be combined to respective ends of the substrate 250 to fix the substrate 250. In this case, the tension applier 311 pressurizes the respective ends of the substrate 250 in a downward direction (the direction in which the tube is positioned) so that the substrate 250 may be bent with respect to a contact portion with the tube 210, thereby providing tension to the substrate 250. (Refer to FIG. 6)

Figure 6:
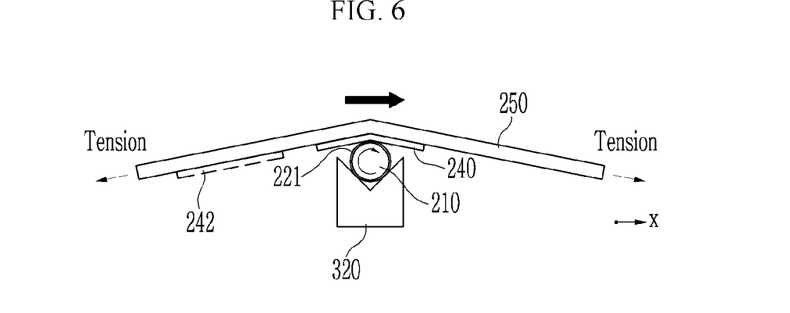

When the substrate 250 is bent and the tension is provided, the substrate 250 may pressurize the tube 210 to increase adherence between the tube 210 and the micro device pattern 240, and accordingly, the micro device pattern 240 on the substrate 250 may be further well transferred to the surface of the tube 210. The tension applier 311 may increase or reduce a bending degree of the substrate 250 depending on intensity of adherence of the adhesive layer 221 coated on the surface of the tube 210. For example, when the adherence of the adhesive layer 221 is weak, the bending degree of the substrate 250 may be increased to increase the pressure so that the micro device pattern 240 may be well transferred to the adhesive layer 221.

When the substrate 250 has a flexible film shape, the first supporter 310 may be realized in a roller shape in which respective ends of the film are combined to each other. The tension applier 311 may generate tension to the substrate 250 by moving the roller downward and pulling the substrate 250 to respective sides, thereby allowing better transferring.

A plurality of micro device patterns may be provided on the substrate 250, and when one of the micro device patterns 240 is transferred to the tube 210, the transferred tube 210 may be separated from the second supporter 320, and another micro device pattern 242 may then be transferred to a new tube.

Figure 7:
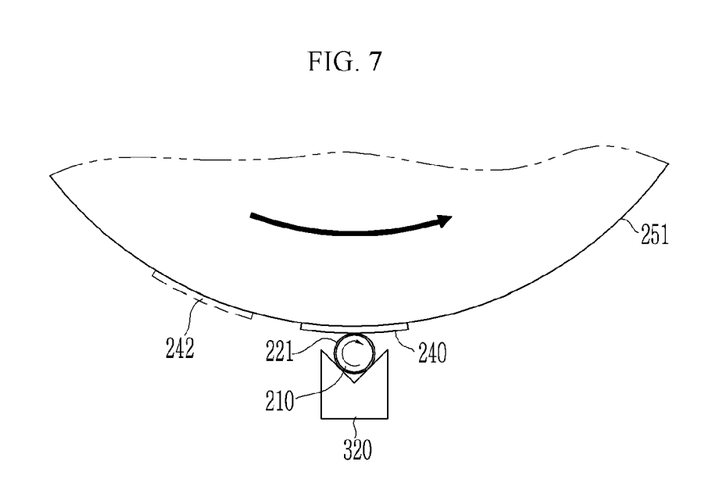

As shown in FIG. 7, the substrate 251 may have a roller shape. The axis-direction of the substrate 251 in a roller shape may be parallel to the axis-direction of the tube 210.

A plurality of micro device patterns may be provided to the substrate 251 in a roller shape. When one of the micro device patterns 240 is transferred to the tube 210 combined to the second supporter 320, the transferred tube 210 may be separated from the second supporter 320. The new tube may be combined to the second supporter 320 and the roller rotates, so another micro device pattern 242 may be transferred to a new tube.

Figure 8:
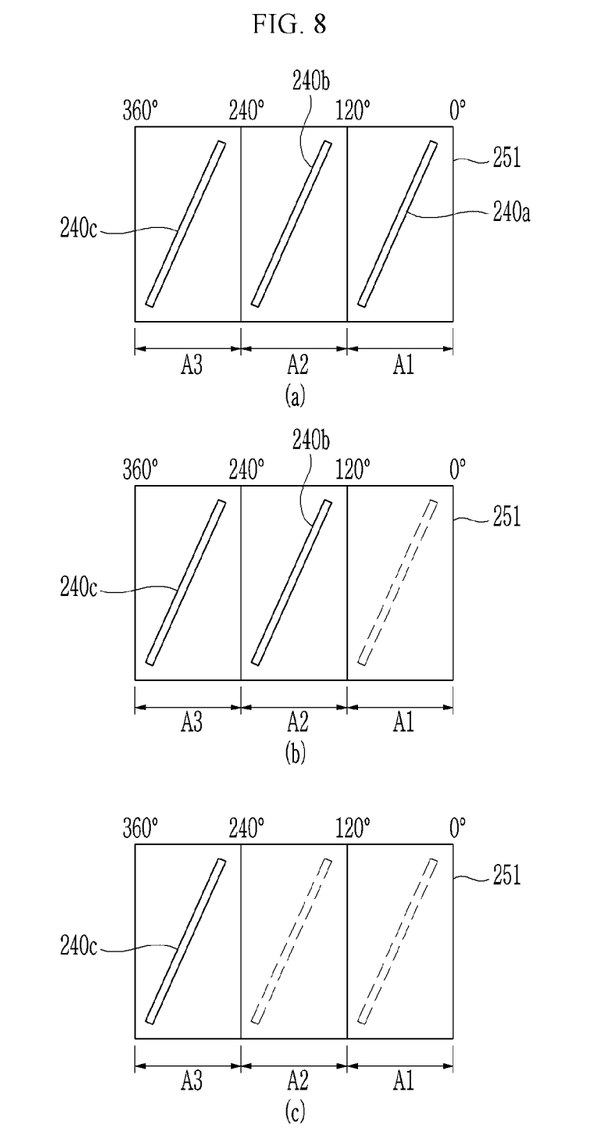

As shown in FIG. 8, a plurality of micro device patterns 240a, 240b, and 240c may be provided in areas A1, A2, and A3 with a predetermined angle range in the circumferential direction on the substrate 251 in a roller shape. FIG. 8 illustrates, for better comprehension, a surface of the substrate 251 in a roller shape, in a plan view.

That is, referring to FIG. 8 (a), the areas A1, A2, and A3 may be formed on the substrate 251 in a roller shape within the angle range of 120 degrees in the circumferential direction, and the respective micro device patterns 240a, 240b, and 240c may be provided in the corresponding areas A1, A2, and A3. In this state, the micro device pattern 240a provided in the first area A1 may be transferred to the tube while the substrate 251 in a roller shape rotates with the angle of 0 to 120 degrees.

The micro device pattern 240b provided in the second area A2 may be transferred to a new tube while the substrate 251 in a roller shape rotates with the angle of 120 to 240 degrees in the state in which the tube to which the micro device pattern 240a provided in the first area A1 is transferred is separated and a new tube is prepared (refer to FIG. 8 (b)).

In a like manner, the micro device pattern 240c provided in the third area A3 may be transferred to another new tube while the substrate 251 in a roller shape rotates with the angle of 240 to 360 degrees in the state in which the tube to which the micro device pattern 240b provided in the second area A2 is transferred is separated and the other new tube is prepared (refer to FIG. 8 (c)).

As described above, a plurality of micro device patterns are prevented from being transferred to one tube by providing the respective micro device patterns 240a, 240b, and 240c in the corresponding areas A1, A2, and A3.

The substrate 251 in a roller shape has been described with reference to FIG. 8, and a plurality of micro device patterns may also be respectively provided in the separated areas of the substrate, such as a rigid plate type of substrate or a flexible film type of substrate described with reference to FIG. 5.

That is, areas may be on the plate or film type of substrate 250 shown in FIG. 5 with predetermined gaps and in the direction crossing the axis-direction of the tube 210. The micro device patterns may be in the respective areas, and the respective micro device patterns provided in the corresponding areas may be prevented from being transferred to a single tube and may be transferred for the respective tubes.

Figure 9:
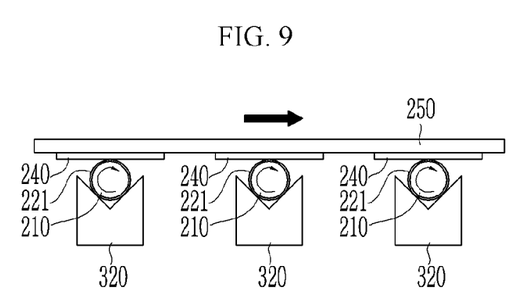
FIG. 9 and FIG. 10 show exemplary views of an operational example of an apparatus for transferring a micro device on a curved surface according to a second exemplary embodiment of the present invention.

FIG. 9 shows an exemplary view of an operational example of an apparatus for transferring a micro device on a curved surface according to a second exemplary embodiment of the present invention. In the present exemplary embodiment, a plurality of micro device patterns may be provided on one substrate, a plurality of tubes may be provided, and the micro device patterns may be simultaneously transferred to the respective tubes, and the remaining configurations are equivalent to the above described first exemplary embodiment, so no repeated description will be provided.

As shown in FIG. 9, the substrate 250 may be of a plate type or a film type. A plurality of micro device patterns 240 may be provided on the substrate 250.

A plurality of second supporters 320 and tubes 210 may be provided to correspond to a plurality of micro device patterns 240. The second supporters 320 and the tubes 210 may be provided with gaps therebetween, and the gaps correspond to the gaps of the micro device patterns 240 in the direction crossing the axis-direction of the tube 210.

In the present exemplary embodiment, the respective micro device patterns 240 provided on the substrate 250 may be simultaneously transferred to the corresponding tubes 210, thereby increasing transfer efficiency.

In the present exemplary embodiment, areas may be formed at predetermined gaps in the direction crossing the axis-direction of the tube 210 on the substrate 250, and the respective micro device patterns may be provided in the corresponding areas. According to this, the respective micro device patterns in the corresponding areas may be prevented from being transferred to one tube and may be transferred for the respective tubes.

Figure 10:
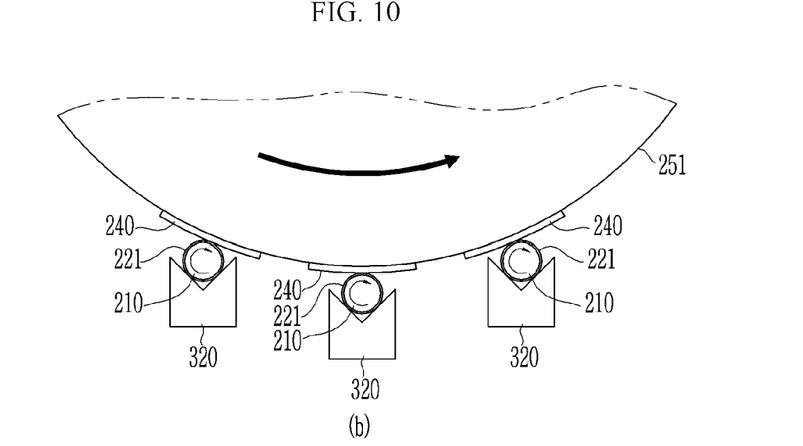

As shown in FIG. 10, the substrate 251 may have a roller shape, and a plurality of micro device patterns 240 may be provided on the substrate 251 in a roller shape.

A plurality of second supporters 320 and tubes 210 may also be provided to correspond to a plurality of micro device patterns 240. The axis-direction of the substrate 251 in a roller shape and the axis-direction of a plurality of tubes 210 may be parallel to each other, and the respective tubes 210 may be installed so that the adhesive layer 221 may be closely attached to the respective corresponding micro device patterns from among the micro device patterns provided to the substrate 251 in a roller shape. By this, the respective micro device patterns 240 provided on the substrate 251 in a roller shape may be simultaneously transferred to the corresponding tubes 210, thereby increasing transfer efficiency.

In the present exemplary embodiment, the area may be given with a predetermined angle range in the circumferential direction on the substrate 251 in a roller shape, and the respective micro device patterns may be provided in the corresponding areas. Through this, the respective micro device patterns in the corresponding areas may be prevented from being transferred to one tube and may be transferred to the respective tubes.

Figure 11:
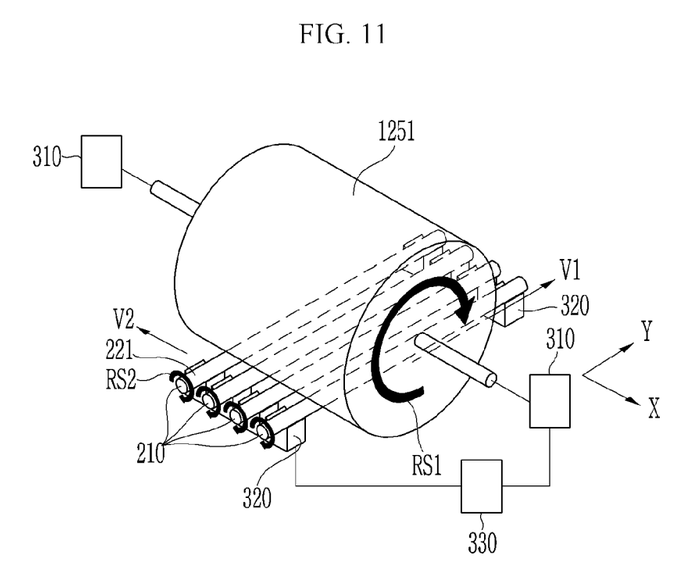
FIG. 11 and FIG. 12 show exemplary views of an apparatus for transferring a micro device on a curved surface according to a third exemplary embodiment of the present invention.
Figure 12:
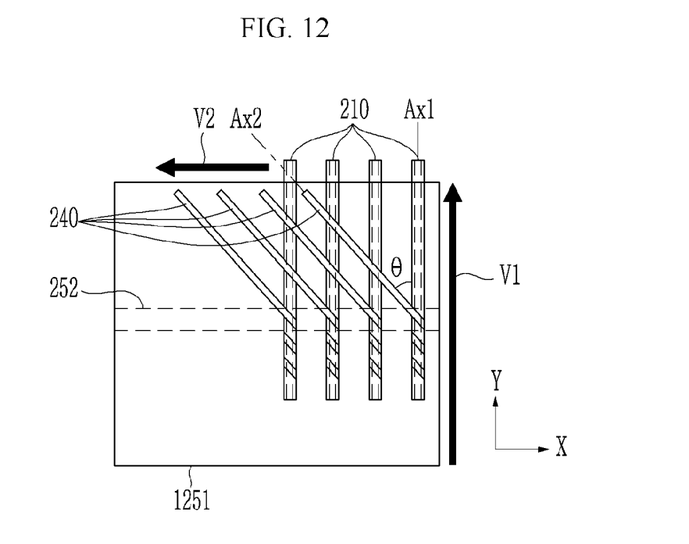

FIG. 11 and FIG. 12 show exemplary views of an apparatus for transferring a micro device on a curved surface according to a third exemplary embodiment of the present invention. FIG. 11 shows a perspective view of an apparatus for transferring a micro device on a curved surface, and FIG. 12 shows a plan view of FIG. 10. In the present exemplary embodiment, the axis-directions of the roller (or a substrate in a roller shape) and the tube may cross each other, and the remaining configurations are equivalent to the above-described exemplary embodiment, so no repeated description will be provided.

As shown in FIG. 9, regarding the apparatus for transferring a micro device on a curved surface, the first supporter 310 may support a roller 1251 with the external circumferential surface on which a plurality of micro device patterns 240 are provided so that the roller 1251 may rotate with respect to the axis-direction of the roller 1251.

The second supporter 320 may support a plurality of tubes 210 having an external circumferential surface on which the adhesive layer 221 is coated so that the tubes may rotate with respect to the axis-directions of the respective tubes 210. The second supporter 320 may support the respective tubes 210 so that the external circumferential surface of each the tube 210 may contact the external circumferential surface of the roller 1251. The second supporter 320 may support the tube 210 so that the radius direction of each the tube 210 may cross the length direction of the device pattern 240, and a plurality of second supporters 320 may be provided to correspond to the respective tubes 210.

The axis-directions of the respective tubes 210 may be parallel to each other, and the axis-direction of the tube 210 may cross the axis-direction of the roller 1251. For example, the axis-direction of the roller 1251 may be the X-axis direction, and the axis-direction of the tube 210 may be the Y-axis direction.

The driver 330 may independently and relatively move the first supporter 310 and the second supporter 320 so that a plurality of micro device patterns 240 on the external circumferential surface of the roller 1251 may be respectively transferred to the respective external circumferential surfaces of the rotating tubes 210.

The driver 330 may control a rotating linear velocity RS1 of the roller 1251 to be equivalent to a moving speed V1 thereof. In other words, when a radius of the roller 1251 is set to be R and a rotating angular velocity of the roller 1251 is set to be W, the rotating linear velocity RS1 of the roller 1251 may be RW, which may be equivalent to the moving speed V1 of the roller 1251.

The driver 330 may drive so that the rotating linear velocity RS2 of each tube 210 may be equivalent to the moving speed V2 thereof. In other words, when the radius of the tube 210 is set to be r and the rotating angular velocity of the tube 210 is set to be w, the rotating linear velocity RS2 of the tube 210 may be rw, which may be equivalent to the moving speed V2 of the tube 210.

The moving speed V1 of the roller 1251 and the moving speed V2 of the tube 210 may be determined by the angle between the rotation center axis Ax1 of the tube 210 and the micro device pattern 240, that is, the angle (θ) with a virtual axis Ax2 of the micro device pattern 240 in the length direction.

That is, it may be given that (moving speed V2/moving speed V1)=tan θ.

By this, the roller 1251 and the tube 210 may maintain their contact on a contact portion 252 without sliding, and the micro device pattern 240 of the roller 1251 may be stably transferred to each tube 210.

In the present exemplary embodiment, a plurality of micro device patterns 240 may be provided without being limited to the area formed on the external circumferential surface of the roller 1251 with a predetermined angle range in the circumferential direction. Therefore, the number of the micro device patterns provided to the roller may be further increased compared to the above-described first exemplary embodiment and second exemplary embodiment, thereby increasing transfer efficiency.

The description of the present invention is merely illustrative, and it will be understood by those skilled in the art that various changes in a specific form and details may be made therein without a change of the technical spirit or essential features of the present invention. Accordingly, it shall be understood that the exemplary embodiments described above are illustrative in all aspects, and are not limited. For example, each constituent element described in a singular form may be distributed and fed, and similarly, constituent elements described as being distributed may be fed in a combined form.

The scope of the present invention is represented by the claims, and it shall be construed that all of changes or modified forms derived from the meaning and the scope of the claims and equivalent concepts thereof are included in the scope of the present invention.

DESCRIPTION OF SYMBOLS

210: tube
221: adhesive layer
231: sacrificial layer
240, 240a, 240b, 240c, 241, 242: micro device pattern
250, 251: substrate
310: first supporter
311: tension applier
320: second supporter
330: driver
1251: roller

What is claimed is:

1. An apparatus for transferring a micro device on a curved surface, comprising:
 a first supporter for supporting a substrate on which a micro device pattern is provided;
 a second supporter for rotating a tube having an external circumferential surface on which an adhesive layer is coated with respect to an axis-direction of the tube, positioning the external circumferential surface of the tube to contact the substrate, and supporting the tube so that a length direction of the device pattern crosses a radius direction of the tube; and
 a driver for transferring the micro device pattern on the substrate to an external circumferential surface of the rotating tube by moving at least one of the first supporter and the second supporter in a rectilinear way,
 wherein the first supporter is installed on respective sides of the substrate in a direction crossing an axis-direction of the tube, and includes a tension applier for applying tension to the substrate in the direction crossing the axis-direction of the tube.

2. The device of claim 1, wherein
a plurality of micro device patterns are provided on the substrate,
a plurality of second supporters and tubes are installed to correspond to the plurality of micro device patterns, and
the plurality of second supporters and the plurality of tubes are separated from each other at gaps that correspond to gaps of the plurality of micro device patterns in a direction crossing the axis-direction of the plurality of tubes.

3. The device of claim 2, wherein
the substrate has a planar shape, and
the plurality of micro device patterns are respectively provided in areas at predetermined gaps on the substrate in a direction crossing an axis-direction of the plurality of tubes.

4. The device of claim 2, wherein
the substrate has a roller shape, and
the first supporter supports the substrate in a roller shape so that the substrate rotates with respect to an axis-direction of the substrate in a roller shape.

5. The device of claim 4, wherein
the axis-direction of the substrate in a roller shape and the axis-direction of the plurality of tubes are parallel to each other, and
the plurality of tubes are installed to be closely attached to corresponding micro device patterns from among the plurality of micro device patterns having an external circumferential surface provided to the substrate in a roller shape.

6. The device of claim 5, wherein
the plurality of micro device patterns are respectively provided in areas formed with a predetermined angle range in a circumferential direction on the substrate in a roller shape.

7. The device of claim 4, wherein
the driver moves the first supporter and the second supporter, respectively, independently in a rectilinear way.

8. The device of claim 7, wherein
the respective axis-directions of a plurality of tubes are parallel to each other, and
respective axis-directions of the plurality of tubes cross an axis-direction of the substrate in a roller shape.

9. The device of claim 7, wherein
the driver drives so that a rotating linear velocity of the substrate in a roller shape is equivalent to a rectilinear moving speed, and it drives so that respective rotating linear velocities of the plurality of tubes are equivalent to a rectilinear moving speed.

* * * * *